United States Patent [19]

Wakasugi

[11] 4,252,839
[45] Feb. 24, 1981

[54] TUNING FORK-TYPE QUARTZ CRYSTAL VIBRATOR AND METHOD OF FORMING THE SAME

[75] Inventor: Makoto Wakasugi, Sayama, Japan

[73] Assignee: Citizen Watch Company Limited, Japan

[21] Appl. No.: 864,271

[22] Filed: Dec. 27, 1977

[30] Foreign Application Priority Data

Dec. 29, 1976 [JP] Japan .................................. 51-160055
Feb. 8, 1977 [JP] Japan .................................. 52-12871
Feb. 17, 1977 [JP] Japan .................................. 52-16524

[51] Int. Cl.$^3$ ............................................. B05D 3/06
[52] U.S. Cl. ................................... 427/53.1; 427/100; 427/272; 427/282
[58] Field of Search ................. 427/38, 100, 272, 282, 427/53

[56] References Cited

U.S. PATENT DOCUMENTS

| | | | |
|---|---|---|---|
| 3,548,494 | 12/1970 | Haring | 427/282 |
| 3,864,161 | 2/1975 | Thompson | 427/100 |
| 3,914,836 | 10/1975 | Hafner et al. | 427/38 |
| 4,049,857 | 9/1977 | Hammer | 427/282 |

*Primary Examiner*—John H. Newsome

[57] ABSTRACT

A metal electrode film is formed by evaporation on a tuning fork-type quartz crystal vibrator by means of a thin flat mask which has a portion of reduced thickness so that the metallic evaporant is deposited beneath the thinner portion of the mask. In forming electrodes on a tuning fork-type quartz crystal vibrator having X, Y and Z surfaces, a mask has a portion which is positioned in the X-plane between the evaporative deposition source and the inner end of the slit between the tines of vibrator so that the metallic film is prevented from being deposited on portions of the X and Y surfaces of the vibrator adjacent to the inner end of the slit.

7 Claims, 18 Drawing Figures

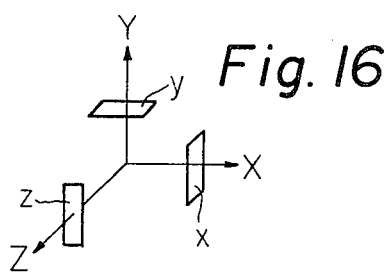
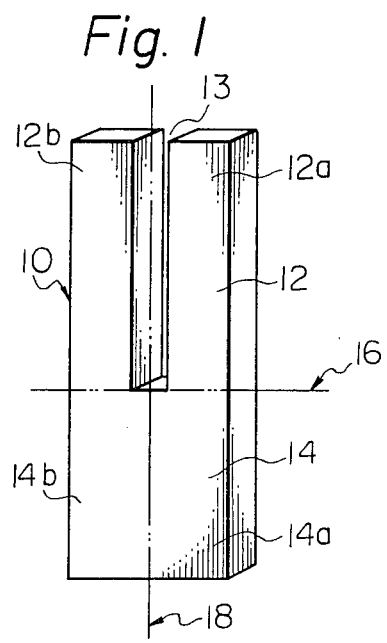
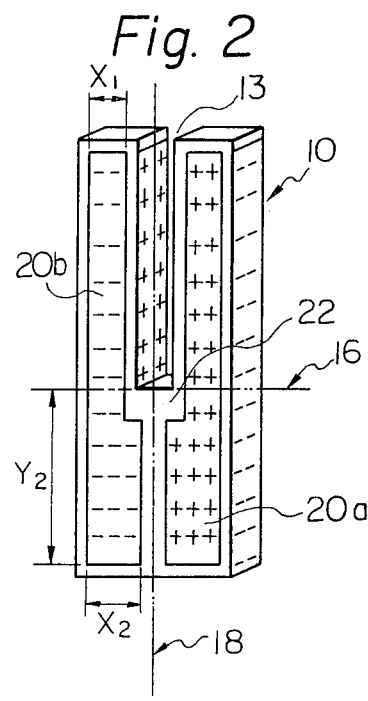
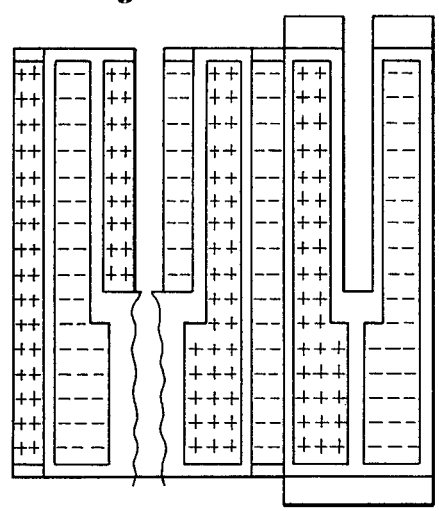
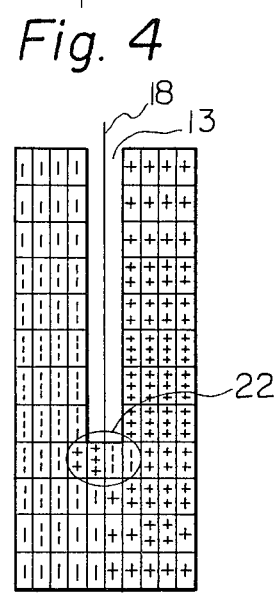

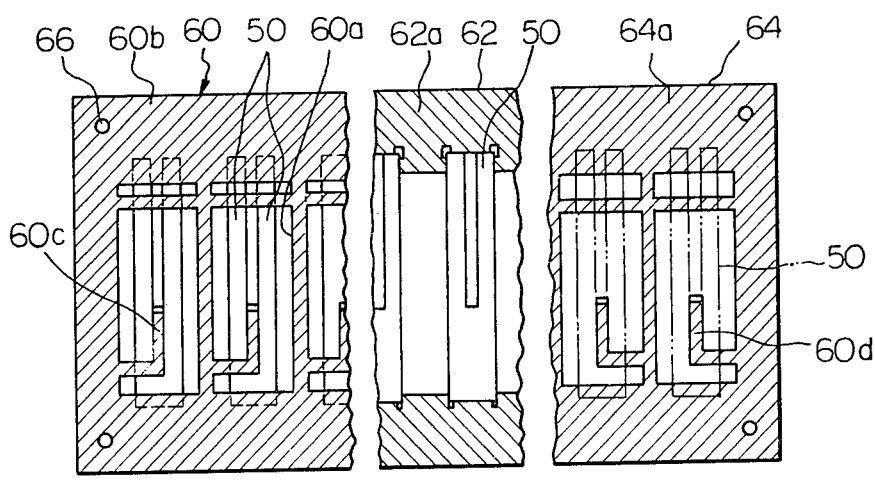
Fig. 13A  Fig. 13B  Fig. 13C
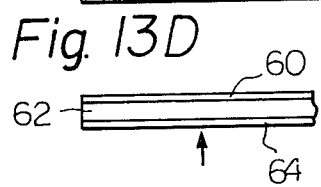
Fig. 13D
Fig. 14  Fig. 15
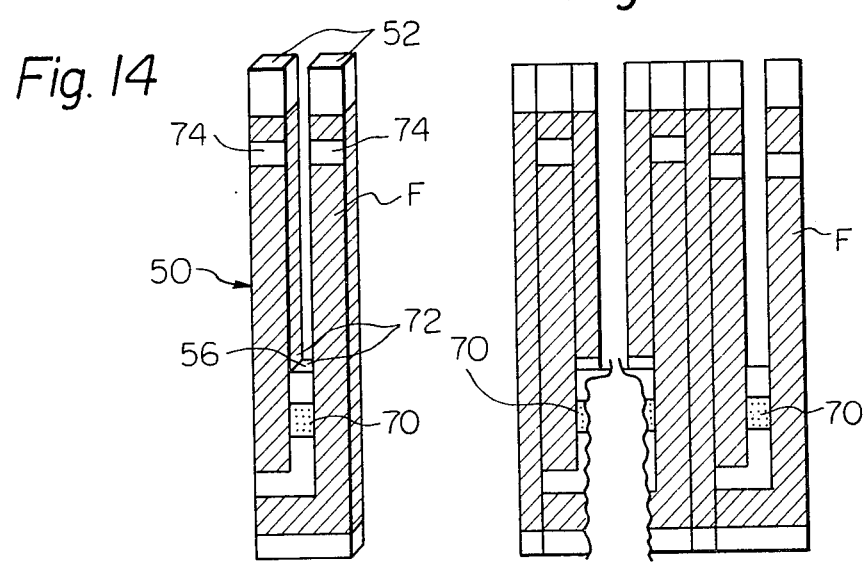

TUNING FORK-TYPE QUARTZ CRYSTAL VIBRATOR AND METHOD OF FORMING THE SAME

FIELD OF INVENTION

This invention relates to a tuning fork-type quartz crystal vibrator and a method of forming the same.

BACKGROUND OF THE INVENTION

Tuning fork-type quartz crystal vibrators, owing to their shock resistance and the fact that they can be readily miniaturized, have long been used in quartz wristwatches for the purpose of producing oscillations which serve as a time standard. However, the prior art technique regarding the electrode structure of a vibrator of the type described was defective in that only the resonating portions of the vibrator element, i.e., only the tines of the tuning fork, were considered when deciding the electrode structure. The mode of oscillation of the tuning fork stem as well as the magnitude and distribution of the electrical charges generated there were virtually disregarded.

On the other hand, although there has been an increasing tendency toward vibrator miniaturization and thickness reduction to meet the requirements of ever smaller quartz wristwatches, there can now be seen a deterioration in vibrator performance and reliability which accompanies extreme reductions in the vibrator size and thickness.

SUMMARY OF THE INVENTION

It is, therefore, an object of the invention to provide a tuning fork-type quartz crystal vibrator which is compact, thin and which assures sufficient performance, by means of an improved electrode structure which enhances vibrator performance in the fundamental oscillating mode.

It is another object of the present invention to provide a manufacturing process for a tuning fork-type quartz crystal vibrator which enables the vibrator to be miniaturized and reduced in thickness at low cost without detracting from the operating characteristics of the vibrator.

BRIEF DESCRIPTION OF DRAWINGS

These and other objects, features and advantages of the present invention will become more apparent from the following description in conjunction with the accompanying drawings, in which:

FIG. 1 is a perspective view of a preferred embodiment of a tuning fork-type quartz crystal according to the present invention which is useful in defining the various portions of the vibrator;

FIG. 2 is a perspective view of the tuning fork-type quartz crystal vibrator which is useful in explaining the principle of the electrode structure according to the present invention;

FIG. 3 is an expanded view of FIG. 2 showing the distribution of charges on each surface of the tuning fork;

FIG. 4 is useful in explaining the theoretical foundations of the invention;

FIGS. 13A through 13C are plan views showing the arrangement between a tuning fork-type quartz crystal vibrator and the components of a jig for forming electrodes;

FIG. 13D is a front view of FIG. 13A;

FIG. 14 is a perspective view of a tuning fork-type quartz crystal vibrator provided with a partially divided electrode pattern as formed by the use of the mask shown in FIG. 13A; and FIG. 15 is an expanded view of FIG. 14.

FIG. 16 is a diagram illustrating the X, Y and Z axes and the x, y and z planes of a quartz crystal vibrator.

DESCRIPTION OF PREFERRED EMBODIMENTS

Figure 5:
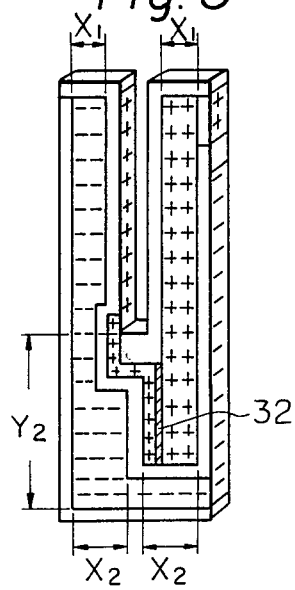
FIG. 5 is a perspective view of a tuning fork-type quartz crystal vibrator showing a specific embodiment of the electrode structure according to the present invention.

Referring now to FIG. 1, a tuning fork-type quartz crystal vibrator comprises a vibrating element in the form of a tuning fork 10 having resonating tines 12 which include a right tine 12a and left tine 12b, and a stem portion 14 which includes a right stem portion 14a and left stem portion 14b. A boundary 16 is defined between the tines and stem portion, and a center line 18 parallel to the Y-axis (to be described hereafter) passes between the right and left tines 12a, 12b. Three sets of axes X, Y, Z oriented in the direction of vibrator width, length and thickness, respectively, also correspond substantially to the electrical, mechanical and optical axes of the quartz crystal. Further, surfaces x, y, z define surfaces which are orthogonal to the respective axes X, Y, Z.

The vibrating element 10 has an electrode 20a disposed on the right side and an electrode 20b disposed on the left side, which electrodes are respectively positively and negatively charged, the charge distribution at this instant is shown in FIGS. 2 and 3. In FIG. 2, each of the electrodes 20a and 20b includes a first electrode section formed on each tine and having a width X1, and a second electrode section formed on the stem portion 14 and having a width X2, the width X1 being slightly narrower than the width X2. A blank portion 22 is provided on each of the z-surfaces at a position adjacent the bottom of a slit 13 between the tines 12a and 12b. The electrode dimension Y2 on the stem 14 of the vibrator is substantially equal to the length of the stem itself, and the right and left electrodes are symmetrically disposed about the center line 18.

Reference will now be had to FIG. 4 which shows an electrical charge pattern on the vibrator shown in FIG. 2. In FIG. 4, the z-surface of the vibrator is divided i a multiplicity of rectangular regions which are assigned positive and negative signs to give a typical representation of space charge and its magnitude. More specifically, in the present case, a region which has been provided with a maximum charge possess either 3 + or − signs, a region with a charge of intermediate magnitude possesses either 2 + or − signs, and a region provided with a charge of minimum magnitude possesses only one + or − sign. It should be noted that the magnitude of the charge on the z-surface of the stem portion is fairly large. Accordingly, in order to gather to as great an extent as possible the space charges on the z-surface of the vibraotr, it is necessary to carefully consider the electrode structure on the stem portion of the vibrator as well as that on the tines.

Another characteristic of this electrode structure relates to the sign of the charges. More specifically, the electric field on the z-surface to the right of the center line 18 is substantially a + field while that to the left of the center line is substantially a − field. It can be seen, however, that the distribution of charge is reversed in the vicinity of the bottom portion of the slit 13 between the tines. It is presumed that this may be attributable to the appearance in the z-surface of an extension effect from the inward surfaces (x-surfaces) of the slit 13 between the tines. Accordingly, when designing the electrode structure it is necessary to devise some method of either eliminating this area of reverse sign distribution or connecting charges of identical sign.

Figure 6:
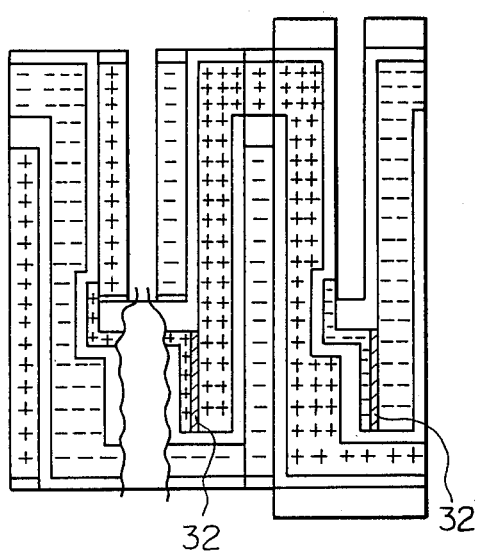
FIG. 6 is an expanded view of FIG. 5.
Figure 7:
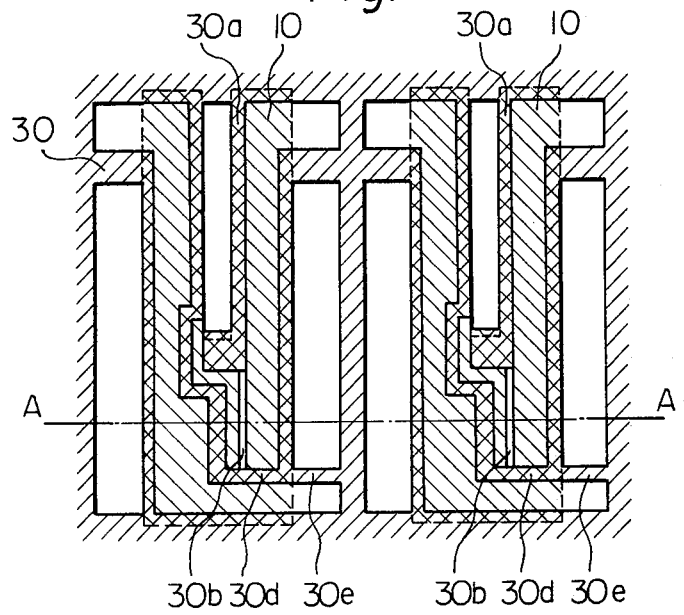
FIG. 7 is a plan view showing a deposition process according to the invention.

A preferred embodiment of a tunning fork-type quartz crystal vibrator according to the present invention is shown in FIGS. 5 and 6 in which FIG. 5 shows that the distribution of charges generated at any instant in time is + on the right side and − on the left side of the center line, where the electrodes have substantially the same fundamental configuration as that illustrated in FIGS. 2 through 4. FIG. 7 shows the shape of a thin mask 30 which is used to form the electrodes through a single deposition treatment. The portions designated by the oblique lins slanting downwardly to the right show the tuning fork vibrator 10 previously positioned, the outline of the vibrator being indicated by the broken lines. The mask 30 formed from a thin metal plate such as stainless steel and usually having a thickness of approximately 0.1 mm is processed by photo-etching. The portion of the plate that remains after the photo-etching treatment, namely the actual body of the mask 30, is designated by the oblique lines slanting downwardly to the left. The mask 30 must have an overall bridge-like structure supported at two sides owing to its extreme thinness. In other words, if the mask is supported at only one side in the manner of a cantilever with a long overhang, the mask will curl during the deposition process and will not adhere to the vibrator. The occurrence of this undesirable phenomenon will short circuit the electrodes which must be isolated. The portion particularly involved is the region 30a of FIG. 7. Since the mask in this region possecces the configuration of a cantilever with a long overhang, this condition should be avoided.

Figure 8:
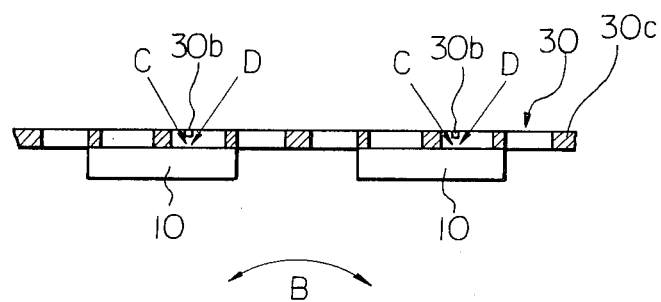
FIG. 8 is a cross-sectional view of FIG. 7.

FIG. 8 is a cross-sectional view taken along the line A—A of FIG. 7 and shows how the cantilever-like portion mentioned above can be avoided. The mask is designated at 30 and its cross-section by the hatched area 30a. The mask 30 has a thin bridge portion 30b, i.e., a portion of reduced thickness which is approximately half that of the mask itself. The mask regions 30a and 30d are thus connected by the thin bridge portin 30b so as to define a bridge-like structure which is supported at both ends. When the electrodes are actually formed such as by a deposition process, rotating the vibrator 10 in the direction of the arrow B results in the deposition of material from either the direction C or D, whereby it is possible to deposit a metal film on the z-surface of the vibrator directly below the thin bridge portion 30b of the mask. This can be accomplished because the material can be made to circumvent or creep around and under the thin bridge portion during the rotation of the vibrator. In FIGS. 5 and 6, an electrode region 32 having a reduced thickness is shown by the shaded portion which corresponds to the region directly below the thin bridge 30b as formed by the above-described deposition of material. Finally, the mask region 30e of the mask 30 in FIG. 7 will form an unconnected portion on the x-surface of the vibrator, although this problem can be solved if a mash which is the mirror-image of mask 30 is used when forming the electrodes on the opposite side of the vibrator.

Figure 9:
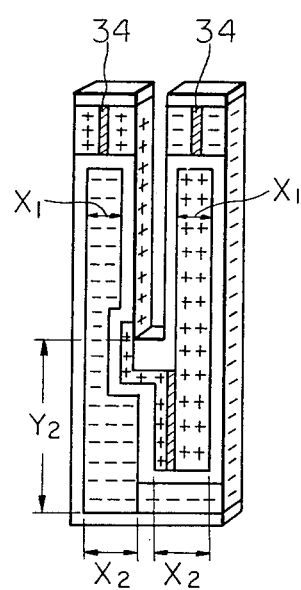
FIG. 9 is a perspective view of an electrode structure according to another embodiment of the present invention.
Figure 10:
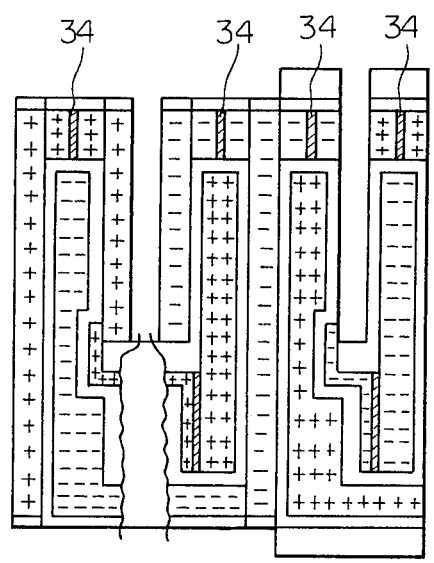
FIG. 10 is an expanded view of FIG. 9.

In FIGS. 9 and 10 which are perspective and expanded views of another embodiment of a quartz crystal vibrator according to the invention, the application of the method according to the invention makes it possible to form an electrode region 34 on each end portion of z-surfaces of the times through a single deposition treatment.

According to the above description, the electrode structure of the present invention is characterized in that the width X1 of the electrode on each tine is narrower than the corresponding width X2 on the stem portion, the electrode dimension Y on the stem of the vibrator is substantially equal to the length of the stem itself, and in that a blank region in which no electrode is formed is provided adjacent the bottom of the slit between the tines of the vibrator on its z-surface. Further, the stem portion adjacent the center line 18 is provided with a region of a prescribed width where no electrode is formed. In addition, as illustrated in FIGS. 5, 6, 9 and 10, the electrodes are symmetrical with respect to the center line 18 exept at the portion adjacent the bottom of the slit and at the lowermost end of the stem portion. Accordingly, adopting the electrode structure of the present invention permits the most effective collection of the space charges produced on the z-surface of the vibrator, thereby to provide a low value of crystal impedence which is one important characteristic of a quartz crystal vibrator. In actual practice, the method of the invention provided a mean crystal impedence of less thatn 10 K$\Omega$ in a tuning fork-type quartz crystal vibrator capable of oscillating at 32,768 Hz.

The present invention mentined above also makes it possible to form an electrode structure through a single deposition treatment by interposing a tuning fork-type quartz crystal vibrator between a pair of masks disposed on the z-surfaces of the vibrator. By providing the mask with a thin bridge portion connected between thick bridge portions, the problem of a cantilever-like overhang is eliminated and an electrode can be deposited on the surface of the vibrator below the thin bridge portion by permitting the electrode material to circumvent the thin bridge portion.

The method of forming the electrodes according to the present invention thus prevents mask deformation so that an extremely reliable electrode pattern can be obtained through a single deposition treatment, an advantage which greatly lowers cost.

Figure 11:
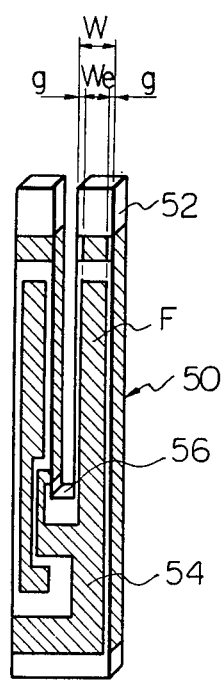
FIG. 11 is a perspective view of another preferred embodiment of a tuning fork-type quartz crystal vibrator having electrodes formed in accordance with the present invention.

Another preferred embodiment of a tuning fork-type quartz crystal vibrator according to the present invention is illustrated in FIG. 11 in which the width $w_e$ of the electrodes on the z-surfaces of the tines 52 in the X-direction must be chosen such that the ration $w_e/w$ does not fall below 60% to preclude a deterioration in vibrator characteristics. As a result, the maximum value of a clearance g must not exceed $(w \| w_e)/2$. Thus if w is taken to equal 0.3 mm, the maximum value of g is a mere 60μ. The conventional method of electrode formation using a thin metallic mask not only made it difficult to obtain the necessary precision but was also disadvantageous in that the mask itself was structurally weak. This led to many occasions where electrodes were short-circuited or where sufficient insulative resistance could not be obtained; hence, it was difficult to increase the yield of the manufacturing process. Furthermore, it is necessary to isolate the electrodes adjacent the bottom 56 of the slit between the tines 52 since the x-surface on the inward sides of the tines are charged to mutually opposite signs. Although it is now possible to form a divided electrode pattern on the z-surfaces of the tuning fork vibrator by means of a chemical etching process, it is difficult to strip off only the thin metallic film of the electrodes adjacent the bottom 56 of the slit at the same time that the divided electrodes are formed on the z-surfaces. Although good precision can be obtained, stripping off the fine portions of the electrode film when the photo resist is exposed to light is made difficult by the fact that the photo resist will curl when exposed.

Turning to FIGS. 13A to 13C for a description of the initial steps of a method for forming electrodes shown in FIG. 11, FIG. 13A is a plan view showing a tuning fork-type quartz crystal vibrator positioned on a jig for forming electrodes, FIG. 13B is a plan view which shows how the vibrator is arranged with respect to the jig frame, FIG. 13C is a plan view showing the arrangement between the jig and a mask, and FIG. 13D is a front view of FIG. 13A. More specifically, a mask designated at 60 is processed in the form indicated by the shaded area in FIG. 13A. In other words, the surface of the vibrator 50 is provided with a metallic electrode film F which is deposited through windows 60a of the mask 60. The frame 62 holds the quartz crystal vibrator 50 so that it will not move with respect to the upper mask 60 and a lower mask 64. The arrangement between the vibrator and frame is illustrated in FIG. 13B where the upper mask 60 has been removed. The shaded area 62a shows the portion of the frame 62 which remains after processing. In FIG. 13C, the vibrator 50 is indicated by the phantom line with the upper mask 60 and frame 62 having been removed. The planar arrangement of the lower mask 64 is illustrated along with the shaded area 64a which is the portion of the lower mask that remains after processing. Holes 66 are provided to properly position the upper and lower mask 60, 64 with respect to the frame 62. If a tuning fork-type quartz crystal vibrator which is masked and positioned in this manner is provided with a deposited layer applied in the direction of the arrow in FIG. 13D, and if the jig is simultaneously rotated about the Y-axis of the vibrator, a metallic electrode film F having the structure shown in FIG. 14 will be formed.

In FIGS. 14 and 15, the metallic electrode film portion 70, indicated by the dotted region, corresponds to the portion masked by the reversed L-shaped portion 60c and the L-shaped portion 60d of the upper and lower masks 60, 64 as shown in FIGS. 13A and 13C. The formation of this electrode region is normally not expected. However, if the thickness of the portion 60c, 60d at those areas corresponding to the region 70 is reduced to half that of the mask thickness so that a gap equal to half the thickness of the masks is defined between these thinned portions and the z-surface of the vibrator, the deposition material can be made to circumvent or creep around and under these portions of the masks so as to form the metallic electrode film 70. Further, although the portions 60c, 60d in FIGS. 13A, 13C possess a cantilever-like configuration, the mask pattern is simple and it will suffice if a precision of at most 20 μm is attained. Thus, a thickness and width of more than 0.1 mm is possible, providing a rigid structure which will readily adhere to the z-surface of the vibrator as long as the vibrator is not subjected to any externally applied impact.

The portions 60c, 60d are also intended to form a blank portion 72 adjacent the bottom 56 of the slit between the vibrator tines 52. The blank portion 72 at the ends of the tines 52 need not be formed using a mask. However, portions which do not require high precision or portions where an electrode can be readily divided by a metallic mask can be provided with a blank portion 74 using this method.

Figure 12:
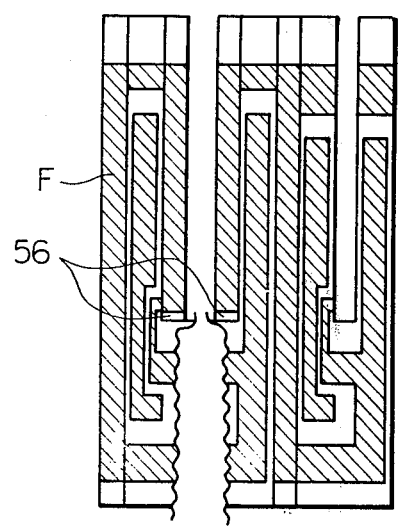
FIG. 12 is an expanded view of FIG. 2.

In the next step, the tuning fork-type quartz crystal vibrator 50 shown in FIGS. 14 and 15 is coated with a photo resist which is then removed from portions where the electrodes are to be divided. Then, using aqua regia or the like, the metallic electrode film F is partially removed to provide the electrode structure illustrated in FIGS. 11 and 12. Alternatively, instead of this chemical etching method, a laser beam or the like can be employed to partially remove the electrode film F.

By way of summation, a method of forming electrodes on a tuning fork-type quartz crystal vibrator mentioned above the tines of which possess a length of less than 0.4 mm and which vibrate at a low frequency comprises the steps of using a metallic mask during a metallic film deposition treatment in such a manner that the metallic film will not adhere to the x- and z-surfaces adjacent the bottom of the slit between the tines, and then employing a chemical etching or laser beam process to remove the unnecessary portions of the metallic film, thereby to complete the electrode formation process.

The effects of the above-noted electrode formation method are as follows. First, a tuning fork-type quartz crystal vibrator with good operating characteristics can be obtained even if the vibrator is subminiaturized. This derives from the fact that a large charge can be generated due to the existance of the electrodes even on the x-surfaces of the vibrator, and because the electrodes on the z-surfaces can be provided with ideal clearance. Second, the yield of the manufacturing process can be increased. This is attributable to the fact that short circuits between electrodes can be prevented by adopting the present method. In the past, attempts at forming electrodes through the sole use of a metallic mask resulted in short-circuits due to the fact that the deposition material tended to creep around and under the mask. Although it is not impossible to isolate the electrodes solely through the use of chemical etching or laser beam techniques, it is difficult to remove the electrode film from the x- and y-surfaces adjacent the bottom of the slit, i.e., the blank portion 72. To do so by means of chemical etching would mean the exposure to light of the x- and y-surfaces simultaneous with the irradiation of the z-surface; in principle, highly precise irradiation of the prescribed areas is not possible. On the other hand, if a laser beam is used, there is a need for means for varying beam focus at a position adjacent the bottom of the slit between the tines, or means for moving the vibrator itself in the direction of beam focus change. This increases processing time and does not necessarily assure high quality. According to the present invention, a simple pattern is formed by a metallic mask at the time that the metallic film is to be deposited, whereby the subsequent steps for forming the electrodes can be readily performed.

What is claimed is:

1. In a method of forming electrodes on a tuning fork-type quartz crystal vibrator oriented in a rectangular coordinate system such that X, Y and Z axes are parallel to the vibrator width, length and thickness, respectively, the vibrator including tines and a metallic electrode film being deposited on x, y and z surfaces of the vibrator, said surfaces being orthogonal to the X, Y and Z axes respectively, said metallic electrode film being deposited by evaporative deposition using a mask, the improvement characterized in that said mask has a portion which is positioned in the X-plane between the evaporative deposition source and the inner end of the slit between the tines of said vibrator, whereby said metallic film is prevented from being deposited on portions of the x and y surfaces of the vibrator adjacent to said inner end of the slit.

2. A method according to claim 1, in which after deposition of said metallic film, selected portions thereof are removed by an etching operation in a single plane.

3. A method according to claim 1, in which after deposition of said metallic film, selected portions thereof are removed by laser beam action in a single plane.

4. A method according to claim 1, in which said mask has a first surface which is substantially flat and oriented in a single plane, a second surface which is oriented in a plane parallel to the plane of said first surface and is in contact with a surface of said vibrating element, with a least one portion of reduced thickness being provided in said mask so that a space is provided between said reduced thickness portion and said vibrating element surface, whereby said metallic evaporant is passed to the portion of said vibrating element surface situated beneath said reduced thickness portion to be deposited upon said portion of the vibrating element surface.

5. A method according to claim 4, in which said portion of reduced thickness has a thickness about one half that of other portions of said mask.

6. A method according to claim 5, in which said portion of reduced thickness has a thickness of about 0.5 mm and other portions of said mask have a thickness of about 1.0 mm.

7. A method according to claim 4 in which said mask has a cantilever masking portion having a free end, and said portion of reduced thickness connects said free end of said cantilver portion with another portion of said mask.

* * * * *